United States Patent [19]

Walls et al.

[11] Patent Number: 4,665,124

[45] Date of Patent: May 12, 1987

[54] RESIN

[75] Inventors: John E. Walls, Hampton; Major S. Dhillon, Belle Mead; Gabor I. Koletar, Berkeley Heights, all of N.J.

[73] Assignee: American Hoechst Corporation, Somerville, N.J.

[21] Appl. No.: 918,734

[22] Filed: Oct. 14, 1986

Related U.S. Application Data

[62] Division of Ser. No. 762,089, Aug. 2, 1985.

[51] Int. Cl.$^4$ .............................................. C08F 8/00
[52] U.S. Cl. ........................................................ 525/61
[58] Field of Search ........................................ 525/61

[56] References Cited

U.S. PATENT DOCUMENTS

| | | | |
|---|---|---|---|
| 2,179,051 | 11/1939 | Morrinson | 525/61 |
| 2,269,217 | 1/1942 | McNally et al. | 525/56 |
| 2,915,504 | 12/1959 | Berardinelli | 525/61 |
| 3,471,589 | 10/1969 | Rinehart | 525/61 |
| 3,514,421 | 5/1970 | Kershaw | 525/61 |
| 3,926,918 | 12/1975 | Shibata et al. | 525/61 |
| 3,963,618 | 6/1976 | Muir | 525/61 |
| 4,085,079 | 4/1978 | Kmetz et al. | 524/354 |
| 4,413,091 | 11/1983 | Iwaski et al. | 525/61 |
| 4,426,492 | 1/1984 | Steckler | 525/61 |

OTHER PUBLICATIONS

Kirk-Othmar, "Encyclopedia of Polymer Science and Technology", vol. 14, pp. 208, et seq., 1971.

*Primary Examiner*—Joseph L. Schofer
*Assistant Examiner*—J. M. Reddick
*Attorney, Agent, or Firm*—Richard S. Roberts; James R. Cartiglia

[57] ABSTRACT

This invention relates to a resin having the general formula

—A—B—C— wherein a plurality of each of components A, B and C occur in ordered or random sequence in the resin and wherein A is present in said resin at about 5% to about 20% by weight and comprises groups of the formula

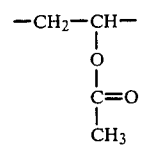

B is present in said resin at about 4% to about 30% by weight and comprises groups of the formula

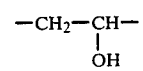

and C is present in said resin at about 50% to about 91% by weight and comprises acetal groups consisting of groups of the formulae

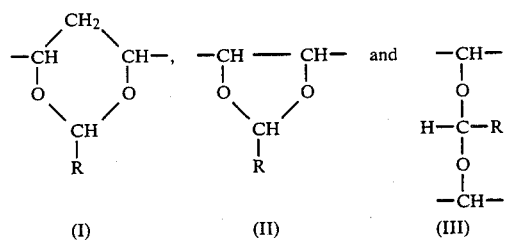

where R is lower alkyl or hydrogen, and wherein said group I is present in component C from about 75% to about 85%; group II is present in component C from about 3% to about 5%; and group III is present in component C from about 10% to about 22%.

19 Claims, No Drawings

RESIN

This is a divisional of co-pending application Ser. No. 06/762,089 filed on Aug. 2, 1985.

BACKGROUND OF THE INVENTION

The present invention relates to a resin which may be used in the production of photosensitive elements and which renders such photosensitive elements developable by aqueous developers.

Although there are many resins known which may be used in the production of photosensitive elements in general, the majority of them are severely limited by the need to develop the photosensitive elements with solutions containing substantial amounts of organic solvents. Such developing solutions are undesirable in that their effluent is toxic and environmentally harmful and the solvents are costly.

It is known to produce resins for photosensitive applications containing 5 to 40% polyvinyl acetal, 5 to 35% azide-aryl substituted polyvinyl acetal, 1 to 45% polyvinyl acetate and 1 to 60% polyvinyl alcohol groups, as shown in U.S. Pat. No. 4,413,091. It is also known to prepare interpolymers for the stabilization of formaldehyde solutions wherein the interpolymer is composed of vinyl acetate, vinyl acetal and vinyl alcohol, as shown in U.S. Pat. No. 4,085,079. Similar polymers are also disclosed in U.S. Pat. No.2,179,051. Each of these resins, though, when used in photosensitive elements, must be developed with developers which contain organic solvents.

What is desired, therefore, is a resin which may be used to produce a photosensitive element which is developable with a solution which does not necessarily contain organic solvents and need only contain minor amounts of salts and surfactants. Such resin should allow the photosensitive element to develop in a dissolving fashion, thereby substantially eliminating the presence of particles which may be re-deposited onto the element surface and interfere with the operation of the element. Such resin should also allow the production of a photosensitive element having superior sensitivity, image resolution, run length, and post-exposure and post development image contrast, and which is compatible with commonly used printing plate and press processing solutions.

SUMMARY OF THE INVENTION

This invention relates to a resin which may be used in the production of a photosensitive element. More particularly, this invention relates to a resin having the general formula $$-A-B-C-$$

wherein a plurality of each of components A, B and C occur in an ordered or random sequence in the resin and wherein A is present in said resin at about 5% to about 20% by weight and comprises groups of the formula

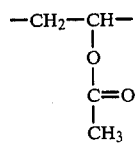

B is present in said resin at about 4% to about 30% by weight and comprises groups of the formula

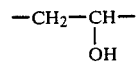

and C is present in said resin at about 50% to about 91% by weight and comprises acetal groups consisting of groups of the formulae

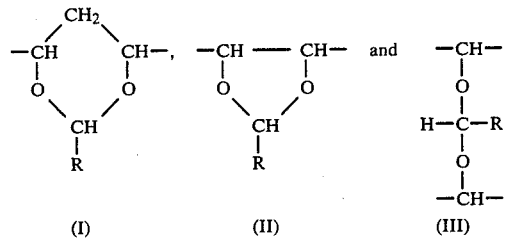

where R is lower alkyl or hydrogen, and wherein said group I is present in component C from about 75% to about 85%, group II is present in component C from about 3% to about 5%; and group III is present in component C from about 10% to about 22%.

DETAILED DESCRIPTION OF THE INVENTION

The present invention relates to a resin having the general formula

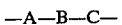

wherein a plurality of each of components A, B and C occur in an ordered or random sequence in the resin and wherein A is present in said resin at about 5% to about 20% by weight and comprises groups of the formula

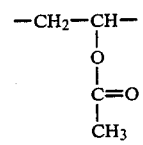

B is present in said resin at about 4% to about 30% by weight and comprises groups of the formula

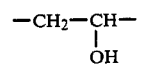

and C is present in said resin at about 50% to about 91% by weight and comprises acetal groups consisting of groups of the formulae

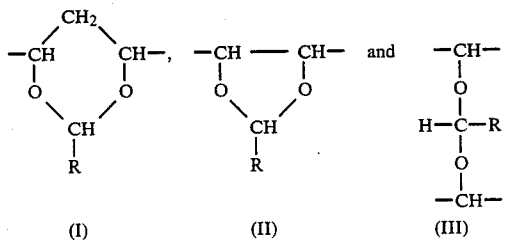

where R is lower alkyl or hydrogen, and wherein said group I is present in component C from about 75% to about 85%; group II present in component C from about 3% to about 5%; and group III present in component C from about 10% to about 22%.

As used in describing the resin of this invention, the term "lower alkyl" refers to a straight or branched chain hydrocarbon having from 1 to 8 carbon atoms and containing no unsaturation.

The polyvinyl alcohol/polyvinyl acetate copolymers useful as a starting material for the production of the resin of this invention are those having from about 75% to about 80% hydrolization by weight and, preferably, an average molecular weight (AMW) of from about 5,000 to about 100,000. As used in this application hydrolization is on a weight basis and not a mole basis. Such copolymers are easily synthesized by methods known to those skilled in the art, or are commercially available. Suitable copolymers include Vinol 523 (AMW≅70,000) and Vinol 205 (AMW≅26,000) available from Air Products Co. of Allentown, Pa.; Elvanol 52-22 (AMW≅72,000) available from DuPont of Wilmington, Del.; and Gelvatol 20-30 (AMW≅10,000), Gelvatol 20-60 (AMW≅60,000), and Gelvatol 20-90 (AMW≅90,000) available from Monsanto Co. of St. Louis, Mo.

The particular copolymer chosen as the starting material depends upon the end use desired for the resin. For instance, if the resin is to be used in the production of a lithographic printing plate, the copolymers are preferably those having higher molecular weights (i.e. about 50,000 to about 100,000). If the resin is to be used in the production of screens for screen printing applications, the copolymers are preferably those having lower molecular weights (i.e. about 5,000 to about 30,000). Although these ranges are generally preferred, they are not critical.

In forming the resin of this invention, the copolymer is first dissolved in a solvent mixture of water and a hydroxyl group containing solvent. The hydroxyl group-containing solvent must be miscible with water, it must be a solvent for the copolymer, and it must be a solvent for the final resin product. Preferably, the hydroxyl group containing solvent is an aliphatic alcohol. Most preferably, the alcohol is one having from about 1 to 4 carbon atoms such as ethanol. In order to ensure that the copolymer molecules of the starting material are not so intertwined with each other nor having tertiary or quaternary structure to the extent that the reaction is interfered with to a substantial degree, the copolymer is preferably dissolved in the solvent mixture for at least 12 hours at elevated temperature (preferably above 50° C.) before the reaction proceeds. This reaction mixture is then maintained at a temperature of at least 50° C. and mixed with vigorous agitation which continues throughout the reaction. Over a period of several hours, an aliphatic aldehyde is then titrated into the reaction mixture to form the acetal groups.

The invention provides a method of preparing the foregoing resin. The process steps include first dissolving a polyvinyl alcohol/polyvinyl acetate copolymer having from about 75% to about 80% hydrolization in a solvent mixture of water and a hydroxyl-group containing solvent to form a reaction solution. This is usually conducted for at least about 12 hours at a temperature of from about 20° C. to the boiling point of the solution depending on the molecular weight of the copolymer. The solution is then adjusted to at least about 50° C. while adding a catalytic amount, preferably from about 1.0% to about 1.5% by weight of an organic sulfonic or inorganic mineral acid. This is a catalytic amount of the acid and is insufficient to cause hydrolization. Titrated into the acidified mixture is an aliphatic aldehyde having the formula R—CHO, wherein R is hydrogen or lower alkyl. The aldehyde is added in an amount sufficient to produce a degree of acetal formation of from about 50% to about 91% by weight. During this titration an additional amount of said hydroxyl group containing solvent is added into said reaction mixture to prevent unwanted precipitation. Preferably one vigorously mixes said reaction mixture throughout the foregoing steps. Preferably the acid is then removed from the mixture by evaporation or the mixture is neutralized with an alkaline salt to a pH of from about 6.5 to 7.5 to quench said reaction mixture. One then effects precipitation of said reaction mixture; washes the precipitate with water; and dries the precipitate so as to have less than about 1% water residue.

The preferred aldehyde is one having the formula R—CHO, wherein R is hydrogen or lower alkyl. Most preferably the aldehyde is acetaldehyde or propionaldehyde. The particular aldehyde chosen may also be related to the end use intended for the resin of this invention. For use in the production of a lithographic printing plate, proprionaldehyde is preferred; for use in the production of a screen printing screen, acetaldehyde is preferred. The amount of aldehyde titrated into the reaction mixture is preferably from about 25% to about 100% by weight of the copolymer. More preferably the amount of aldehyde is from about 28% to about 67% by weight of the copolymer.

As the acetal groups are formed at the expense of the hydroxyl content of the copolymer, the water solubility is reduced. In order to prevent premature precipitation of the product formed, additional amounts of the hydroxyl group containing solvent used in the solvent mixture are titrated simultaneously with the aldehyde to accommodate the product's reduced water solubility and increasing solvent solubility.

In order to properly form the acetal groups, a catalytic amount of an acid is required to be present during the titrations. Preferably the acid used is an inorganic mineral acid or an organic sulfonic acid. Suitable mineral inorganic acids include hydrochloric acid, sulfuric acid and phosphoric acid. Suitable organic sulfonic acids include p-toluene sulfonic acid and stilbene disulfonic acid. Most preferably, the acid catalyst is hydrochloric acid. The acid catalyst is preferably present in the reaction mixture in the amount of from about 1.0% to about 1.5% by weight of the total reaction mixture.

After the titrations are completed, the reaction mixture preferably is neutralized with an alkaline salt in order quench the reaction mixture so as to prevent the deacetalization which may otherwise occur. The neutralization should adjust the pH of the reaction mixture to about 6.5 to about 7.5, and should preferably be 7.0. Suitable alkaline salts for the neutralization include sodium carbonate, potassium carbonate, sodium hydroxide and potassium hydroxide, with sodium carbonate being the most preferred.

After neutralization, the reaction mixture is preferably, although not necessarily, cooled to room temperature (about 22° to 25° C.) and then slowly mixed with water or other suitable compositions such as acetone or methyl ethyl ketone with continued vigorous agitation to effect precipitation. The resulting precipitate is water washed to remove all remaining acid, aldehyde and unreacted copolymer, and is then warm air dried so as to have less than 1% water residue.

The resulting resin contains acetal groups consisting of three types: six-membered cyclic acetals which are present from about 75% to 85%, five-membered cyclic acetals which are present from about 3% to 5% and intermolecular acetals which are present from about 10% to 22%. It is important for the particular characteristics of this resin that all three types of acetal groups are present and in their indicated concentrations.

The resultant resin, when used to form a photosensitive element, is found to be developable with a solution which does not necessarily contain organic solvents and need only contain a minor amount, if any, of salts and surfactants; it allows the photosensitive element to develop in a dissolving fashion, thereby substantially eliminating the presence of particles which may be re-deposited and interfere with the operation of the element; allows the production of a photosensitive element having superior sensitivity, image resolution, run length and post-exposure and post-development image contrast; and is compatible with commonly used plate and press processing solutions.

It is understood, though, that although the use of the resin of this invention to make photosensitive elements is specifically exemplified herein, other uses of the resin are within the contemplation of the invention, for instance, as a sizing for blow molding and as a binder for paints, especially water based paints.

A photosensitive composition which may be prepared using the resin of this invention comprises, for example, an admixture of a diazonium salt, or a photopolymerizable composition and a photoinitiator, and the resin of this invention. The mixture is usually prepared in a solvent composition which is compatible with all the composition ingredients. Suitable solvents for this purpose include water, tetrahydrofuran, butyrolactone, glycol ethers such as propylene glycol monomethyl ether and methyl cellosolve, alcohols such as ethanol and n-propanol, and ketones such as methyl ethyl ketone, or mixtures thereof. Preferably, the solvent comprises a mixture of tetrahydrofuran, propylene glycol monomethyl ether and butyrolactone. The composition is then coated on the substrate and the solvent removed by drying. The composition may also contain other art recognized ingredients such as photoinitiators, colorants, acid stabilizers, plasticizers and exposure indicators in amounts easily determined by those skilled in the art.

Specific examples of light sensitive diazonium materials useful as aforementioned include any suitable light-sensitive diazonium polymeric or monomeric compound which are well known to the skilled artisan, although the polymeric diazonium compounds are preferred. Suitable diazonium compounds include those condensed with formaldehyde such as disclosed in U.S. Pat. Nos. 2,063,631 and 2,667,415, the polycondensation products such as disclosed in U.S. Pat. Nos. 3,849,392 and 3,867,147, and the high photo-speed and co-condensed diazos such as disclosed in U.S. Pat. Nos. 4,436,804 and 4,533,620, all of which are hereby incorporated herein by reference.

A most preferred diazonium salt is the polycondensation product of 3-methoxy-4-diazo-diphenyl amine sulfate and 4,4'-bis-methoxy methyl-diphenyl ether, isolated as the mesitylene sulfonate, as taught in U.S. Pat. No. 3,849,392.

A suitable photopolymerizable composition includes compositions such as a mixture of a polyfunctional acrylic monomer having two or more unsaturated groups and a monofunctional acrylic monomer. When a photopolymerizable composition such as this is being employed, a suitable photoinitiator is usually also present.

Suitable photoinitiators which may be used in this invention are preferably those free-radical photoinitiators having a maximum absorption range of from about 320 to about 400 nm. Examples include the acetophenones, benzophenones, triazines, benzoins, benzoin ethers, xanthones, thioxanthones, acridenes and benzoquinones. More preferred of these are the triazines having the formula

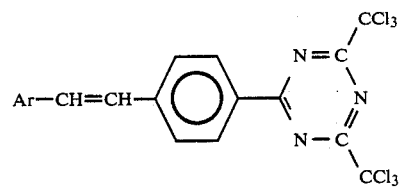

wherein Ar is

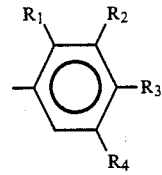

and $R_1$, $R_2$, $R_3$ and $R_4$ are, independently, hydrogen, chlorine, bromine, alkoxy, alkyl ketone, naphthyl or anthracyl, especially bis-trichloromethyl triazine. The most preferred photoinitiator is 2-stilbenyl-4,6-di-(trichloromethyl) triazine.

Suitable acid stabilizers include phosphoric, citric, benzoic, m-nitro benzoic, p(p-anilino phenylazo) benzene sulfonic acid, 4,4'-dinitro-2,2'-stilbene disulfonic, itaconic, tartaric and p-toluene sulfonic acid, and mixtures thereof. Preferably, the acid stabilizer is phosphoric acid.

Exposure indicators (or photoimagers) which may be useful in the photosensitive composition include 4-phenylazodiphenylamine, eosin, azobenzene, Calcozine Fuchine dyes and Crystal Violet and Methylene Blue dyes. Preferably, the exposure indicator is 4-phenylazodiphenylamine.

A plasticizer may also be included in the photosensitive composition to prevent coating brittleness and to keep the coating pliable if desired. Suitable plasticizers include dibutylphthalate, triarylphosphate and substituted analogs thereof, and, preferably, dioctylphthalate.

Colorants which may be included in the photosensitive composition include dyes such as Rhodamine, Calcozine, Victoria Blue and methyl violet, and such pigments as the anthraquinone and phthalocyanine types. Generally, the colorant is present in the form of a pigment dispersion which may comprise a mixture of one or more pigments and/or one or more dyes (approximately 6%) dissolved in a suitable solvent or mixture of solvents in admixture with the resin of this invention (approximately 6%).

In the production of lithographic printing plates, an aluminum containing substrate is first preferably grained by art recognized methods such as by means of a wire brush, slurry of particulates or electrochemical means, for example in a hydrochloric acid electrolyte. The grained plate may then be anodized, for example in sulfuric or phosphoric acid in a manner well known in the art. The grained and optionally anodized surface may then be rendered hydrophilic, for example, by treatment with polyvinyl phosphonic acid, sodium silicate, or the like, which means are also known to the skilled artisan. The thusly prepared plate is then coated with the photosensitive composition prepared through use of the present invention, dried, exposed to actinic radiation through an appropriate mask and developed with an aqueous based developer.

A suitable developer useful for developing a lithographic printing plate made with the resin of the present invention includes an aqueous solution containing one or more of the following groups:

(a) a sodium, potassium or lithium salt of octyl, decyl or dodecyl monosulfate;
(b) a sodium, lithium, potassium or ammonium metasilicate salt; and
(c) a lithium, potassium, sodium or ammonium borate salt; and
(d) an aliphatic dicarboxylic acid, or sodium, potassium or ammonium salt thereof having from 2 to 6 carbon atoms; and
(e) mono-, di-, or tri-sodium or -potassium phosphate.

Other suitable developers include water, benzoic acid or sodium, lithium and potassium benzoates and the hydroxy substituted analogs thereof as well as those developers described in U.S. Pat. No. 4,436,807.

A suitable developer useful for developing a screen printing screen made with the resin of this invention is water.

The following examples illustrate the invention, but it is understood that the invention is not limited thereto.

EXAMPLE 1

75.0 g of Vinol 523, a polyvinyl alcohol/polyvinyl acetate copolymer which has from about 75% to 80% hydroxyl groups by weight and an average molecular weight of about 70,000, is dissolved in a solution comprising 225.0 g of water and 200.0 g of ethanol for 16 hours at 70° C. after which 10.13 g of hydrochloric acid (37%) is added and the temperature adjusted to 60° C. while mixing vigorously. 37.66 g of propionaldehyde is slowly titrated into the reaction mixture. Simultaneously, 250.0 g of ethanol is likewise titrated into the reaction mixture. The mixture is then neutralized to a pH of 7.0 with a sodium carbonate/sodium hydroxide (50/50) mixture. The product is isolated in granular form by precipitation with water. It is then dried so as to have a moisture residue of not greater than 1.0%. A yield of 107 g or about 96% is obtained. The average molecular weight is about 90,000.

Using standard analytical techniques the product is found to consist of 13.6% acetate, 9.8% hydroxyl and 76.6% acetal groups. Of the acetal groups, 80% are found to be six-membered cyclic acetal, 4% are five-membered cyclic acetal, and 16% are intermolecular acetals.

EXAMPLE 2

40.0 g of Gelvatol 20-30, a polyvinyl alcohol/polyvinyl acetate copolymer which has from about 75% to 80% hydroxyl groups by weight and an average molecular weight of about 10,000, is dissolved in a solution comprising 120.0 g of water and 120.0 g of ethanol for 16 hours at 70° C. after which 10.13 g of hydrochloric acid (37%) are added and the temperature is adjusted to 60° C. while mixing vigorously. 12.06 g of acetaldehyde is slowly titrated into the reaction mixture. Simultaneously, 120.0 g of ethanol is likewise titrated into the reaction mixture. The mixture is then neutralized to a pH of 7.0 with a sodium carbonate/sodium hydroxide (50/50) mixture. The product is isolated in granular form by precipitation with water. It is then dried so as to have a moisture residue of not greater than 1.0%. A yield of 49.5 g or about 95% is obtained. The average molecular weight is about 10,500.

Using standard analytical techniques the product is found to consist of 17.0% acetate, 28.0% hydroxyl and 55.0% acetal groups. Of the acetal groups, 80% are found to be six-membered cyclic acetal, 4% are five-membered cyclic acetal, and 16% are intermolecular acetals.

EXAMPLE 3

40.0 g of Gelvatol 20-30, a polyvinyl alcohol/polyvinyl acetate copolymer which has from about 75% to 80% hydroxyl groups by weight and an average molecular weight of about 10,000, is dissolved in a solution comprising 120.0 g of water and 120.0 g of ethanol for 16 hours at 70° C. after which 10.13 g of hydrochloric acid (37%) are added and the temperature is adjusted to 60° C. while mixing vigorously. 27.41 g of hexanal is slowly titrated into the reaction mixture. Simultaneously, 120.0 g of ethanol is likewise titrated into the reaction mixture. The mixture is then neutralized to a pH of 7.0 with a sodium carbonate/sodium hydroxide (50/50) mixture. The product is isolated in granular form by precipitation with water. It is then dried so as to have a moisture residue of not greater than 1.0%. A yield of 64.9 g or about 95% is obtained. The average molecular weight is about 11,000.

Using standard analytical techniques the product is found to consist of 17.0% acetate, 9.0% hydroxyl and 74.0% acetal groups. Of the acetal groups, 80% are found to be six-membered cyclic acetal, 4% are five-membered cyclic acetal, and 16% are intermolecular acetals.

EXAMPLE 4

40.0 g of Gelvatol 20-30, a polyvinyl alcohol/polyvinyl acetate copolymer which has from about 75% to 80% hydroxyl groups and an average molecular weight of about 10,000, is dissolved in a solution comprising 120.0 g of water and 120.0 g of ethanol for 16 hours at 70° C. after which 10.13 g of hydrochloric acid (37%) are added and the temperature is adjusted to 60° C. while mixing vigorously. 35.98 g of octanal is slowly titrated into the reaction mixture. Simultaneously, 120.0 g of ethanol is likewise titrated into the reaction mixture. The mixture is then neutralized to a pH of 7.0 with a sodium carbonate/sodium hydroxide (50/50) mixture. The product is isolated in granular form by precipitation with water. It is then dried so as to have a moisture residue of not greater than 1.0%. A yield of 72.5 g or about 95% is obtained. The average molecular weight is about 11,200.

Using standard analytical techniques the product is found to consist of 17.0% acetate, 10.0% hydroxyl and 73.0% acetal groups. Of the acetal groups, 80% are found to be six-membered cyclic acetal, 4% are five-membered cyclic acetal, and 16% are intermolecular acetals.

EXAMPLE 5

A sample of Formvar 12/85, a polyvinyl acetal resin obtained from Monsanto Corporation of St. Louis, Mo. which has been prepared according to U.S. Pat. No. 2,179,051 is analyzed using standard analytical techniques whereby the product is found to have an average molecular weight of 32,000 and to consist of 23.5% acetate, 5.7% hydroxyl and 70.8% acetal groups. Of the acetal groups, 90–95% are found to be six-membered cyclic acetals, 0% are five-membered cyclic acetals and 5–10% are intermolecular acetals.

EXAMPLE 6

A sample of Butvar B-90, a polyvinyl butyral resin obtained from Monsanto Corporation of St. Louis, Mo. which has been prepared according to U.S. Pat. No. 2,915,504 is analyzed using standard analytical techniques whereby the product is found to have an average molecular weight of 41,000 and to consist of 1% acetate, 19% hydroxyl and 80% acetal groups. Of the acetal groups, 90–95% are found to be six-membered cyclic acetals, 0% are five-membered cyclic acetals and 5–10% are intermolecular acetals.

EXAMPLE 7

Various properties of a resin prepared as in Example 1 are compared with those of Formvar 12/85, as described in Example 5 and Butvar B-90, as described in Example 6. The results are tabulated in Table I. The procedures employed are standard ASTM analytical techniques as shown, unless indicated.

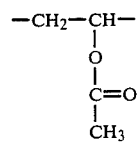

B is present in said resin at about 4% to about 30% by weight and comprises groups of the formula:

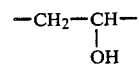

and C is present in said resin at about 50% to about 91% by weight and comprises acetal groups consisting of groups of the formulae:

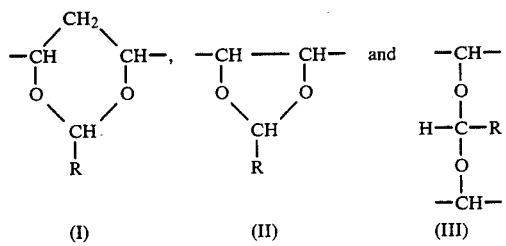

where R is lower alkyl or hydrogen, and wherein said group I. is present in component C from about 75% to about 85%; group II. is present in component C from about 3% to about 5%; and group III. is present in component C from about 10% to about 22% which comprises

TABLE I

|  | Units | ASTM Method | Inventive Resin | Formvar 12/85 | Butvar B-90 |
|---|---|---|---|---|---|
| Tensile Strength | $10^3$ psi | D638-58T | 12.5–16.3 | 6.5–7.5 | 7.0–8.0 |
| Elongation | % | D638-58T | 85 | 30 | 75 |
| Glass Temperature | °C. | D1043-51[1] | 57–71 | 92–100 | 62–68 |
| Dielectric Constant | $10^3$ cps | D150-59T | 2.7 | 3.1 | 3.0 |
|  | $10^6$ ohms | D150-59T | 2.5 | 2.9 | 2.8 |
| Viscosity | ohms | [2] | 2400–3000 | 500–600 | 8,000–18,000 |
| Specific Gravity | — | D792-50 | 1.227 | 1.219 | 1.100 |

[1]The glass transition temperature was determined by ASTM D1043-51 and by Differential Scanning Calorimetry. Results by Differential Scanning Calorimeter run 5 to 8° C. higher than ASTM method.
[2]Viscosity was determined in 15% by weight solutions in toluene:ethanol (60:40) at 25° C. using a Brookfield Viscometer.

It can be readily seen that the resin of this invention shows substantially increased tensile strength and elongation while maintaining substantially similar glass transition temperature, dielectric constant and specific gravity. Viscosity variations are not significant since they are essentially a function of molecular weight.

We claim:

1. A method of preparing a resin having the general formula: which comprises:

—A—B—C— wherein a plurality of each of components A, B and C occur in an ordered or random sequence in the resin and wherein A is present in said resin at about 5% to about 20% by weight and comprises groups of the formula:

(a) dissolving a vinyl alcohol/vinyl acetate copolymer having from about 75% to about 80% hydrolization by weight in a solvent mixture of water and a hydroxyl-group containing solvent to form a reaction solution; and (b) heating said reaction solution at a temperature of from about 50° C. to the boiling point of the solution; and adding a catalytic amount of an acid selected from the group consisting of organic sulfonic acids and inorganic mineral acids to said reaction solution; and (c) titrating an aliphatic aldehyde having the formula R—CHO, wherein R is hydrogen or lower alkyl, into said reaction solution in an amount sufficient to produce a degree of acetal formation of from about 50% to about 91% by weight while titrating a sufficient additional amount of said hydroxyl group containing solvent into said reaction mixture simultaneously with said aldehyde to prevent unwanted precipitation; the foregoing steps being conducted while vigorously mixing said reaction mixture throughout.

2. The method of claim 1 which further comprises either removing said acid from said reaction solution or neutralizing said reaction solution with an alkaline salt to a pH of from about 6.5 to 7.5.

3. The method of claim 1 which further comprise effecting precipitation of said reaction mixture; and washing said precipitate with water; and drying said precipitate so as to have less than about 1% water residue.

4. The method of claim 1 wherein R is methyl.

5. The method of claim 1 wherein R is ethyl.

6. The method of claim 1 which has a molecular weight of from about 5,000 to about 100,000.

7. The method of claim 6 which has a molecular weight of from about 7,500 to about 12,500.

8. The method of claim 6 which has a molecular weight of from about 65,000 to about 95,000.

9. The method of claim 1 wherein said acid is an organic sulfonic acid.

10. The method of claim 9 wherein said organic sulfonic acid is p-toluene sulfonic acid.

11. The method of claim 9 wherein said organic sulfonic acid is stilbene disulfonic acid.

12. The method of claim 1 wherein said acid is an inorganic mineral acid.

13. The method of claim 12 wherein said inorganic mineral acid is selected from the group consisting of hydrochloric acid, sulfuric acid and phosphoric acid.

14. The method of claim 13 wherein said inorganic mineral acid is hydrochloric acid.

15. The method of claim 1 wherein the amount of said aldehyde titrated into said reaction mixture is from about 25% to about 100% by weight of said copolymer.

16. The method of claim 15 wherein the amount of said aldehyde titrated into said reaction mixture is from about 28% to about 67% by weight of said copolymer.

17. The method of claim 1 wherein said hydroxyl group containing solvent is an aliphatic alcohol having from 1-4 carbons.

18. The method of claim 17 wherein said hydroxyl group containing solvent is ethanol.

19. The method of claim 3 wherein precipitation is effected by mixing said reaction mixture with water.

* * * * *